United States Patent
Tahara et al.

(10) Patent No.: US 11,177,783 B2
(45) Date of Patent: Nov. 16, 2021

(54) POWER AMPLIFIER

(71) Applicant: Murata Manufacturing Co., Ltd., Kyoto (JP)

(72) Inventors: Kenji Tahara, Kyoto (JP); Yoshiaki Sukemori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 23 days.

(21) Appl. No.: 16/750,234

(22) Filed: Jan. 23, 2020

(65) Prior Publication Data
US 2020/0244233 A1 Jul. 30, 2020

(30) Foreign Application Priority Data
Jan. 29, 2019 (JP) .............................. JP2019-012765

(51) Int. Cl.
*H03F 3/21* (2006.01)
*H03F 3/60* (2006.01)
*H03F 1/02* (2006.01)

(52) U.S. Cl.
CPC .............. *H03F 3/21* (2013.01); *H03F 1/0211* (2013.01); *H03F 3/604* (2013.01)

(58) Field of Classification Search
CPC ........................................................ H03F 3/21
USPC .................................................. 330/53, 286
See application file for complete search history.

(56) References Cited

U.S. PATENT DOCUMENTS

| | | | | |
|---|---|---|---|---|
| 4,547,745 A | * | 10/1985 | Freitag | H01P 5/16 330/286 |
| 5,485,118 A | * | 1/1996 | Chick | H03F 3/607 330/277 |
| 5,974,041 A | * | 10/1999 | Kornfeld | H03F 1/0277 370/342 |
| 7,064,606 B2 | * | 6/2006 | Louis | H03F 1/0266 330/124 R |
| 8,368,470 B2 | * | 2/2013 | Alidio | H03F 3/605 330/295 |
| 2003/0057436 A1 | | 3/2003 | Chaki | |
| 2004/0056711 A1 | * | 3/2004 | Apel, Jr. | H03F 1/0277 330/51 |
| 2011/0260797 A1 | * | 10/2011 | Lee | H03F 3/211 330/295 |
| 2017/0026001 A1 | * | 1/2017 | Moronval | H01L 23/66 |
| 2020/0313624 A1 | * | 10/2020 | Mokhti | H03F 1/0277 |

FOREIGN PATENT DOCUMENTS

| | | |
|---|---|---|
| JP | 2003-110381 A | 4/2003 |
| JP | 2007-043451 A | 2/2007 |
| JP | 2010-239401 A | 10/2010 |

* cited by examiner

*Primary Examiner* — Patricia T Nguyen
(74) *Attorney, Agent, or Firm* — Pearne & Gordon LLP

(57) ABSTRACT

A power amplifier includes an amplifier circuit group including multiple amplifier circuits, a distributing circuit that distributes an input signal to each of the multiple amplifier circuits, and a combining circuit that combines output signals from the multiple amplifier circuits. Each of the multiple amplifier circuits includes an amplifier transistor including multiple cell transistors having different sizes and bias circuits that supply bias current to the respective cell transistors.

11 Claims, 4 Drawing Sheets

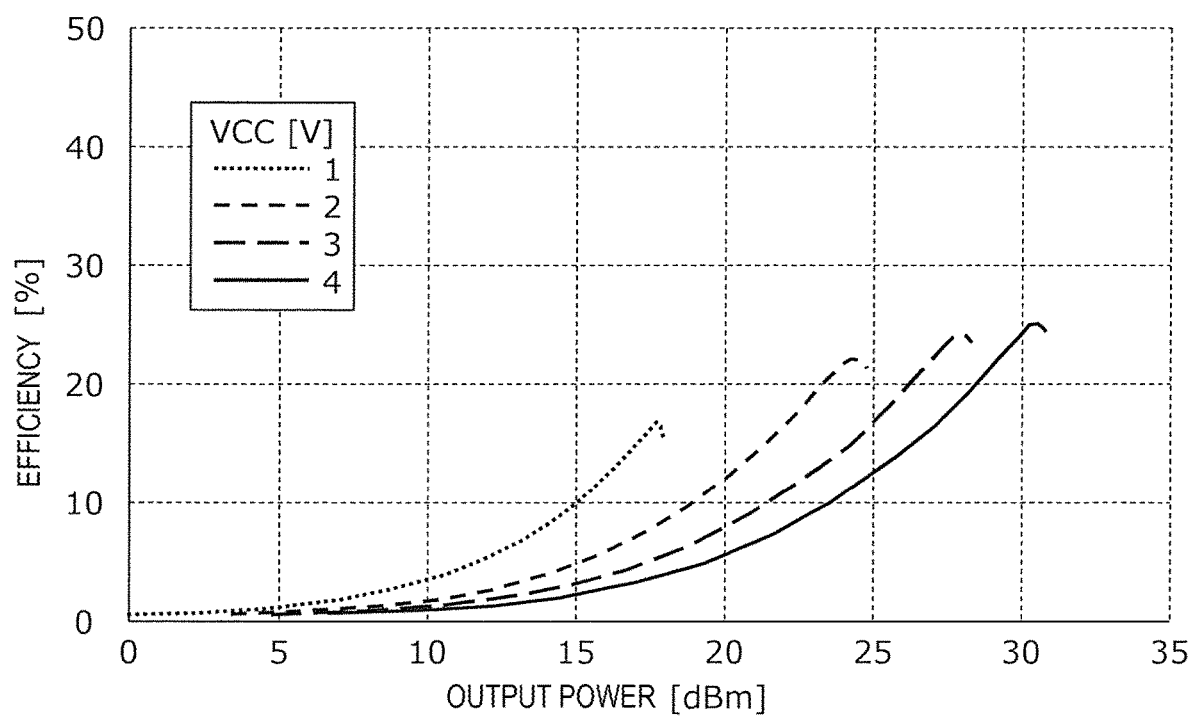

POWER AMPLIFIER

This application claims priority from Japanese Patent Application No. 2019-012765 filed on Jan. 29, 2019. The content of this application is incorporated herein by reference in its entirety.

BACKGROUND

The present disclosure relates to a power amplifier. Power amplifiers have hitherto been known, which connect multiple active elements (for example, transistors) with transmission lines to combine outputs (for example, refer to Japanese Unexamined Patent Application Publication No. 2003-110381).

In the power amplifiers that combine the outputs from the multiple transistors, high output power is produced while excessive current consumption may occur to reduce the efficiency and the gain in production of low output power.

BRIEF SUMMARY

Accordingly, the present disclosure provides a power amplifier that is capable of producing high output power and that is capable of suppressing a reduction in the efficiency in production of low output power.

According to an embodiment of the present disclosure, a power amplifier includes an amplifier circuit group including multiple amplifier circuits, a distributing circuit that distributes an input signal to each of the multiple amplifier circuits, and a combining circuit that combines output signals from the multiple amplifier circuits. Each of the multiple amplifier circuits includes an amplifier transistor including multiple cell transistors having different sizes and bias circuits that supply bias current to the respective cell transistors.

With the above configuration, only the cell transistors of a desired size and a desired number, which are included in the amplifier transistor in a desired amplifier circuit, are capable of being driven in accordance with the bias current supplied from the bias circuit provided for each amplifier circuit. Specifically, all the cell transistors in all the amplifier circuits are capable of being driven in production of high output power and only the cell transistors of a required number in the amplifier circuits of a required number are capable of being driven in production of low output power. As a result, it is possible to optimize the current consumption by performing fine adjustment of the effective total size of the amplifier transistor to provide the power amplifier having excellent efficiency and excellent gain within a wide range of the output power.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 6B is a graph illustrating another example of the efficiency of the power amplifier according to the embodiment.

DETAILED DESCRIPTION

Multiple embodiments of the present disclosure will herein be described in detail with reference to the drawings. All the embodiments described below indicate comprehensive or specific examples. Numerical values, shapes, materials, components, the arrangement of the components, the connection mode of the components, and so on, which are indicated in the embodiments described below, are only examples and are not intended to limit the present disclosure.

First Embodiment

A power amplifier according to a first embodiment will now be described, giving a power amplifier that includes multiple amplifier circuits each using an amplifier transistor capable of switching its effective size and that combines output signals from the multiple amplifier circuits as an example.

Figure 1:
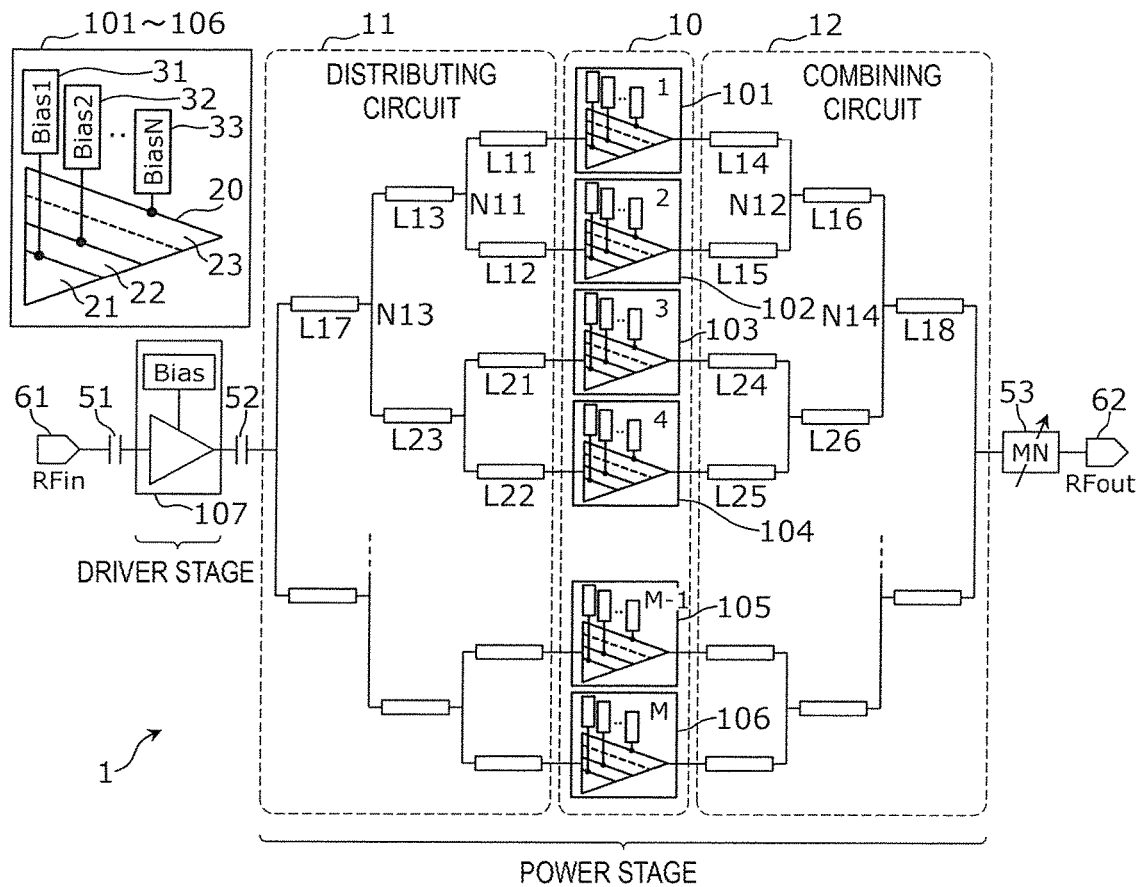
FIG. 1 is a circuit diagram illustrating an example of the configuration of a power amplifier according to an embodiment.

FIG. 1 is a circuit diagram illustrating an example of the configuration of the power amplifier according to the first embodiment. Referring to FIG. 1, a power amplifier 1 includes an amplifier circuit group 10, a distributing circuit 11, a combining circuit 12, an amplifier circuit 107, capacitors 51 and 52, an output matching circuit 53, an input terminal 61, and an output terminal 62.

The amplifier circuit group 10 includes amplifier circuits 101 to 106. Each of the amplifier circuits 101 to 106 includes an amplifier transistor 20 including cell transistors 21 to 23 having different sizes and bias circuits 31 to 33, as illustrated in a box at an upper left portion in FIG. 1. The cell transistors 21 to 23 may be have the same size in all the amplifier circuits 101 to 106. The amplifier circuits 101 to 106 will be described in detail below.

The distributing circuit 11 distributes an input signal to each of the amplifier circuits 101 to 106.

The combining circuit 12 combines the output signals from the respective amplifier circuits 101 to 106.

Although the distributing circuit 11 and the combining circuit 12 are not particularly limited, the distributing circuit 11 and the combining circuit 12 may be composed as a tournament circuit illustrated in FIG. 1 as an example.

In the example in FIG. 1, the distributing circuit 11 includes a transmission line L11 connected between a node N11 and an input end of the amplifier circuit 101, a transmission line L12 connected between the node N11 and an input end of the amplifier circuit 102, and a transmission line L13 connected between the input terminal 61 and the node N11. Here, the amplifier circuit 101 is an example of a first amplifier circuit and the amplifier circuit 102 is an example of a second amplifier circuit. The node N11 is an example of a first node, the transmission line L11 is an example of a first transmission line, the transmission line L12 is an example of a second transmission line, and the transmission line L13 is an example of a third transmission line.

The combining circuit 12 includes a transmission line L14 connected between an output end of the amplifier circuit 101 and a node N12, a transmission line L15 connected between an output end of the amplifier circuit 102 and the node N12, and a transmission line L16 connected between the node N12 and the output terminal 62. Here, the node N12 is an example of a second node, the transmission line L14 is an example of a fourth transmission line, the transmission line L15 is an example of a fifth transmission line, and the transmission line L16 is an example of a sixth transmission line.

The amplifier circuits 103 and 104 and transmission lines L21 to L26 form a circuit having the same configuration as that of a circuit composed of the amplifier circuits 101 and 102 and the transmission lines L11 to L16.

In other words, the power amplifier 1 includes multiple sets of the circuit composed of the first amplifier circuit, the second amplifier circuit, the first transmission line, the second transmission line, the third transmission line, the fourth transmission line, the fifth transmission line, and the sixth transmission line. The transmission lines L13 and L23, which are the third transmission lines of the respective sets, are connected to a node N13, and the transmission lines L16 and L26, which are the sixth transmission lines of the respective sets, are connected to a node N14. The node N13 is an example of a third node and the node N14 is an example of a fourth node.

A transmission line L17 is connected between the input terminal 61 and the node N13, and a transmission line L18 is connected between the node N14 and the output terminal 62. Here, the transmission line L17 is an example of a seventh transmission line and the transmission line L18 is an example of an eighth transmission line.

The distributing circuit 11 and the combining circuit 12 are composed as a tournament circuit in which the above configuration is repeated. The transmission lines L11 to L18 and L21 to L26 may be lines having a length of a quarter of a wavelength λ of a signal to be amplified.

The amplifier circuit 107 composes a driver stage of the power amplifier 1, and the amplifier circuit group 10, the distributing circuit 11, and the combining circuit 12 compose a power stage of the power amplifier 1. The power stage composed of the amplifier circuit group 10, the distributing circuit 11, and the combining circuit 12 may be used as a middle stage and a posterior stage of a three-stage amplifier.

The capacitor 51 is connected between the input terminal 61 and the driver stage, and the capacitor 52 is connected between the driver stage and the power stage. The output matching circuit 53 is connected between the power stage and the output terminal 62. As illustrated in FIG. 1, the impedance of the output matching circuit 53 may be variable.

Next, the configuration of the major portion for switching the effective size of the amplifier transistor 20 in the amplifier circuits 101 to 106 will now be described.

Figure 2:
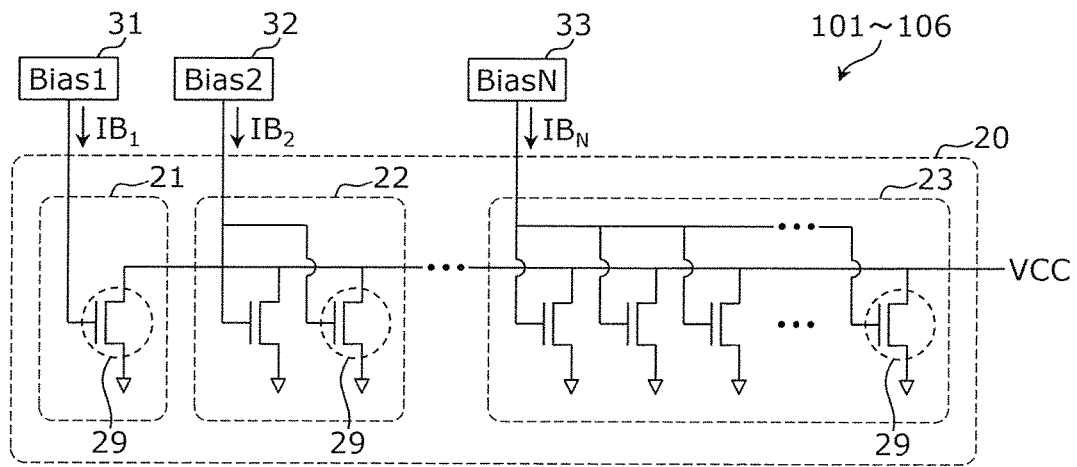
FIG. 2 is a circuit diagram illustrating an example of the configuration of an amplifier transistor according to the embodiment.

FIG. 2 is a circuit diagram illustrating an example of the configuration of the amplifier transistor 20 in the amplifier circuits 101 to 106. Referring to FIG. 2, the amplifier transistor 20 includes the cell transistors 21 to 23 having different sizes.

The respective cell transistors 21 to 23 include small transistors 29 of different numbers. All the small transistors 29 may have the same size. With this configuration, the effective sizes of the cell transistors 21 to 23 are determined based on the numbers of the small transistors included in the cell transistors.

The effective sizes of the cell transistors 21 to 23 may be determined based on the sizes of the small transistors included in the cell transistors. In other words, the sizes of the included small transistors may be varied for each cell transistor, and the effective size of each cell transistor may be determined based on the varied size of the included small transistors. In this case, the effective sizes of the respective cell transistors are different from each other even if the respective cell transistors include the same number of the small transistors.

The size of the small transistor 29 is the area of an emitter in the case of a bipolar transistor and is the opposing area between the drain and the source in the case of a field effect transistor. The size of the cell transistors 21 to 23 is a sum of the sizes of the small transistors 29 included in the cell transistors 21 to 23.

The small transistors 29 included in the cell transistors 21 to 23 are driven for each cell transistor in accordance with bias currents $IB_1$ to $IB_N$ supplied from the bias circuits 31 to 33, respectively. The effective size of the amplifier transistor 20 is switched in accordance with the number of the driven cell transistors and the combination thereof.

Figure 3:
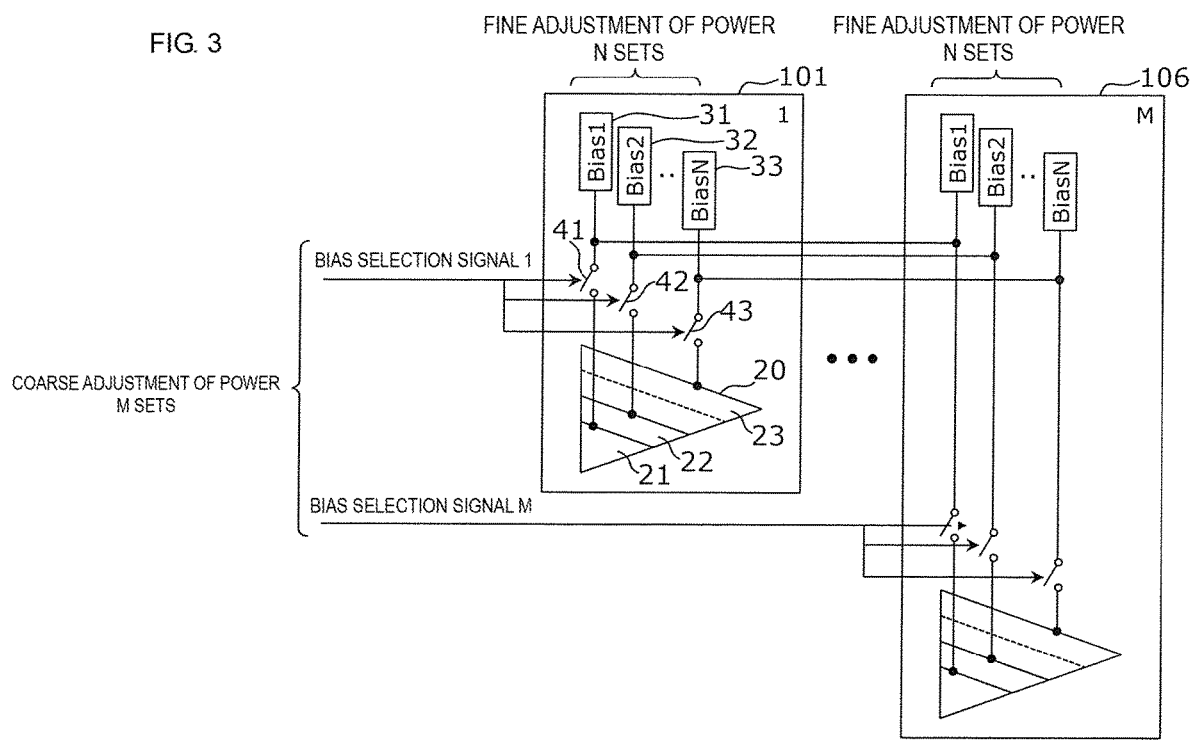
FIG. 3 is a circuit diagram illustrating an example of the configuration of bias circuits according to the embodiment.

FIG. 3 is a circuit diagram illustrating an example of the configuration of the bias circuits 31 to 33 in the amplifier circuits 101 to 106. Referring to FIG. 3, the bias circuits 31 to 33 are connected to the cell transistors 21 to 23 using switches 41 to 43, respectively. The switches 41 to 43 may be provided in the bias circuits 31 to 33, respectively.

In the example in FIG. 3, the switches 41 to 43 are switched between conduction and non-conduction in accordance with bias selection signals 1 to M for the respective amplifier circuits 101 to 106. With this configuration, output power from the power amplifier 1 is subjected to coarse adjustment by driving and stopping the respective amplifier circuits 101 to 106. In addition, supply and stop of the bias currents from the bias circuits 31 to 33 included in the amplifier circuits 101 to 106 may be individually switched in accordance with, for example, a control signal (not illustrated). With this configuration, the output power from the power amplifier 1 is subjected to fine adjustment by driving and stopping the respective cell transistors 21 to 23 included in the amplifier circuits 101 to 106.

The bias circuits 31 to 33 between the different amplifier circuits 101 to 106 may not be connected. Since the driving and the stop for each of the amplifier circuits 101 to 106 and for each of the cell transistors 21 to 23 are enabled in this case, it is possible to perform finer adjustment of the output power.

Driving all the cell transistors in all the amplifier circuits in accordance with the bias selection signals 1 to M produces maximum output power in the power amplifier 1. Driving only the cell transistors of a required number in the amplifier circuits of a required number produces lower output power.

Figure 4:
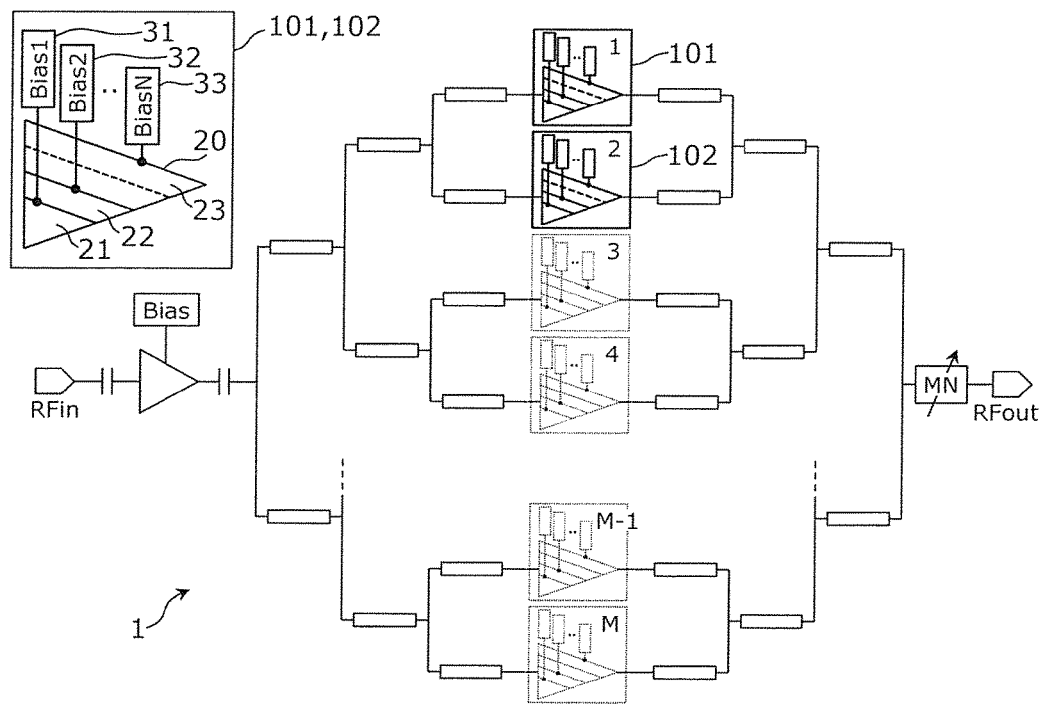
FIG. 4 is a circuit diagram illustrating an exemplary operation of the power amplifier according to the embodiment.

FIG. 4 is a circuit diagram illustrating an exemplary operation of the power amplifier 1. An operation in which only the amplifier circuits 101 and 102 are driven in production of low output power is illustrated in FIG. 4.

Figure 5:
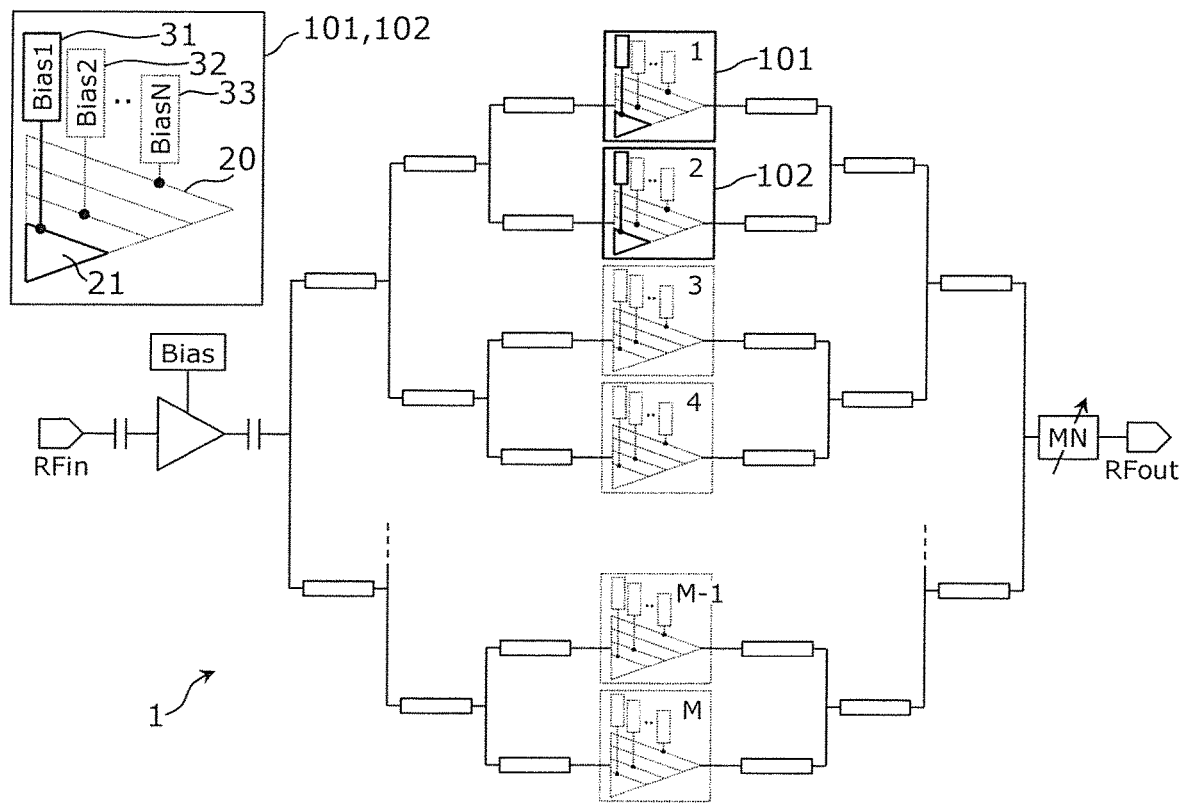
FIG. 5 is a circuit diagram illustrating another exemplary operation of the power amplifier according to the embodiment.

FIG. 5 is a circuit diagram illustrating another exemplary operation of the power amplifier 1. An operation in which only the cell transistor 21 is driven in each of the amplifier circuits 101 and 102 in production of lower output power is illustrated in FIG. 5.

Figure 6A:
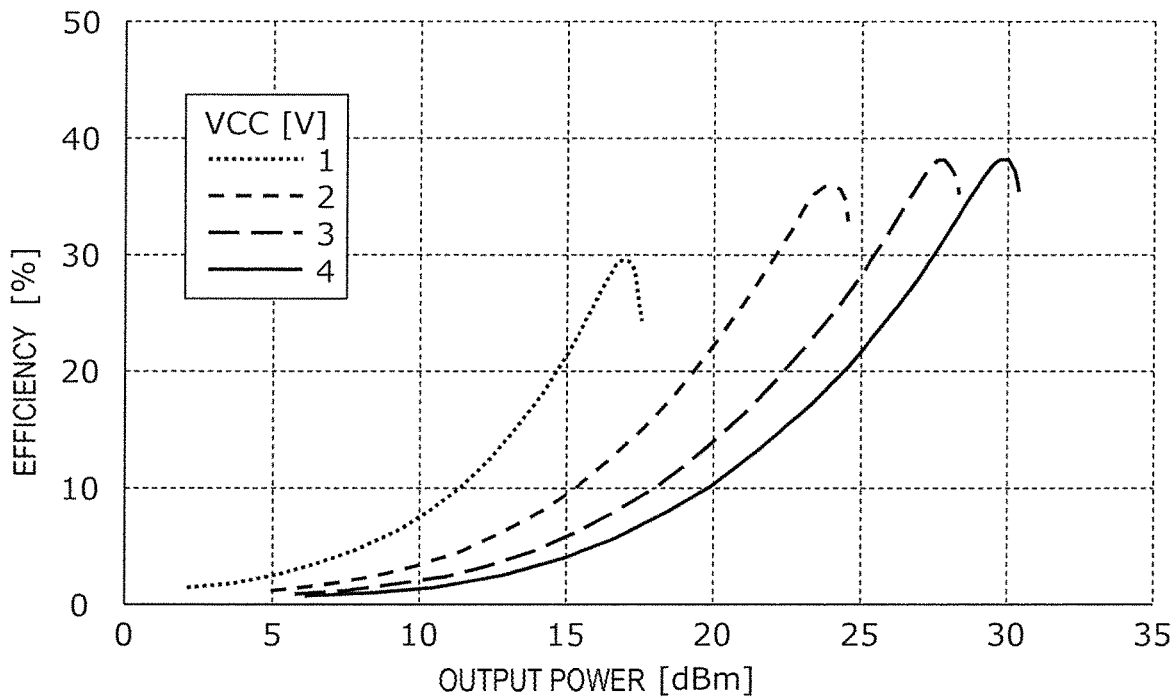
FIG. 6A is a graph illustrating an example of efficiency of the power amplifier according to the embodiment.

FIG. 6A and FIG. 6B are graphs illustrating examples of efficiency with respect to the output power from the power amplifier 1. The efficiencies in production of relative low output powers from about 17 dBm to about 30 dBm using four power supply voltages VCC from about one volt to about four volts are illustrated in FIG. 6A and FIG. 6B.

FIG. 6A corresponds to a case in which the cell transistors driven by the amplifier circuits 101 and 102 are switched among the cell transistors 21 to 23 in accordance with the output power. FIG. 6B corresponds to a case in which all the cell transistors 21 to 23 in all the amplifier circuits 101 to 106 in the power amplifier 1 are driven regardless of the magnitude of the output power. The efficiency in FIG. 6A is improved to the efficiency about 1½ times of the efficiency in FIG. 6B.

The effectiveness of the power amplifier 1, which is capable of driving only the cell transistors of a desired size and a desired number included in the amplifier transistor in a desired amplifier circuit, is confirmed in the above manner.

SUMMARY

As described above, a power amplifier according to an embodiment of the present disclosure includes an amplifier circuit group including multiple amplifier circuits, a distributing circuit that distributes an input signal to each of the multiple amplifier circuits, and a combining circuit that combines output signals from the multiple amplifier circuits. Each of the multiple amplifier circuits includes an amplifier transistor including multiple cell transistors having different sizes and bias circuits that supply bias current to the respective cell transistors.

With the above configuration, only the cell transistors of a desired size and a desired number, which are included in the amplifier transistor in a desired amplifier circuit, are capable of being driven under the control of the bias circuit provided for each amplifier circuit. Specifically, all the cell transistors in all the amplifier circuits are capable of being driven in production of high output power and only the cell transistors of a required number in the amplifier circuits of a required number are capable of being driven in production of low output power. As a result, it is possible to optimize the current consumption by performing fine adjustment of the effective total size of the amplifier transistor to provide the power amplifier having excellent efficiency and excellent gain within a wide range of the output power.

The respective multiple cell transistors may include small transistors of different numbers.

With this configuration, it is possible to easily set the effective sizes of the cell transistors in accordance with the number of the small transistors.

All the small transistors may have the same size.

With this configuration, the easiness of handling and design is improved.

The bias circuit may switch between supply of the bias current and stop thereof for each cell transistor.

With this configuration, it is possible to optimize the current consumption by performing fine adjustment of the effective total size of the amplifier transistor to provide the power amplifier having excellent efficiency and excellent gain within a wide range of the output power.

The power amplifier may have an input terminal through which the input signal is acquired and an output terminal through which the combined output signal is output. The amplifier circuit group may include a first amplifier circuit and a second amplifier circuit. The distributing circuit may include a first transmission line connected between a first node and an input end of the first amplifier circuit, a second transmission line connected between the first node and an input end of the second amplifier circuit, and a third transmission line connected between the input terminal and the first node. The combining circuit may include a fourth transmission line connected between an output end of the first amplifier circuit and a second node, a fifth transmission line connected between an output end of the second amplifier circuit and the second node, and a sixth transmission line connected between the second node and the output terminal.

With this configuration, it is possible to compose the distributing circuit and the combining circuit of a tournament circuit type for the two amplifier circuits.

The power amplifier may include multiple sets of a circuit composed of the first amplifier circuit, the second amplifier circuit, the first transmission line, the second transmission line, the third transmission line, the fourth transmission line, the fifth transmission line, and the sixth transmission line. The third transmission line of each set may be connected to a third node. The sixth transmission line of each set may be connected to a fourth node. A seventh transmission line may be connected between the input terminal and the third node. An eighth transmission line may be connected between the fourth node and the output terminal.

With the above configuration, since the multiple sets of the circuit are capable of being driven in accordance with the output power that is required, it is possible to output higher output power to increase the width of the available output power.

The bias circuit in the first amplifier circuit and the bias circuit in the second amplifier circuit may supply the bias current to the cell transistors of the same number and the same size, among the cell transistors included in each of the first amplifier circuit and the second amplifier circuit.

With this configuration, the easiness of handling and design is improved.

The power amplifier may have an output terminal through which the combined output signal is output. An output matching circuit may be connected between the combining circuit and the output terminal.

With the above configuration, since the output impedance appropriate for the amplifier circuit group is easily achieved, more excellent characteristics are easily achieved.

Impedance of the output matching circuit may be variable.

With the above configuration, since the optimal output impedance is capable of being selected in accordance with the number of the amplifier circuits that are driven, more excellent characteristics are easily achieved.

The amplifier circuit group may compose a power stage of the power amplifier.

With this configuration, it is possible to provide the power amplifier having excellent efficiency and excellent gain within a wide range of the output power.

The distributing circuit 11 and the combining circuit 12 may be transformers.

The present disclosure is widely usable in, for example, various electronic devices as the power amplifier.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:
1. A power amplifier comprising:
a first amplifier circuit and a second amplifier circuit;

a distributing circuit configured to distribute an input signal to each of the first and second amplifier circuits; and a combining circuit configured to combine output signals from the first and second amplifier circuits, wherein each of the first and second amplifier circuits comprises an amplifier transistor and a bias circuit, wherein each amplifier transistor comprises a plurality of cell transistors having different sizes, and wherein each bias circuit is configured to supply a different bias current to each of the respective cell transistors.

2. The power amplifier according to claim 1, wherein the plurality of cell transistors each comprise small transistors, and at least two of the cell transistors comprise a different number of small transistors.

3. The power amplifier according to claim 2, wherein, in at least one of the plurality of cell transistors, all of the small transistors are the same size.

4. The power amplifier according to claim 1, wherein the bias circuits are configured to selectively supply and stop supply of the bias current to the respective cell transistors.

5. The power amplifier according to claim 1, further comprising:

an input terminal; and an output terminal;

wherein the input signal is acquired at the input terminal, and the combined output signal is output from the output terminal, wherein the distributing circuit comprises first, second, and third transmission lines, the first transmission line being connected between a first node and an input of the first amplifier circuit, the second transmission line being connected between the first node and an input of the second amplifier circuit, and the third transmission line being connected between the input terminal and the first node, and wherein the combining circuit comprises fourth, fifth, and sixth transmission lines, the fourth transmission line being connected between an output of the first amplifier circuit and a second node, the fifth transmission line being connected between an output of the second amplifier circuit and the second node, and the sixth transmission line being connected between the second node and the output terminal.

6. A power amplifier comprising:

a plurality of first amplifier circuits;

a plurality of second amplifier circuits;

a distributing circuit configured to distribute an input signal to each of the first and second amplifier circuits, the distributing circuit comprising a plurality of: first transmission lines, second transmission lines, and third transmission lines;

a combining circuit configured to combine output signals from each of the first and second amplifier circuits, the combining circuit comprising a plurality of: fourth transmission lines, fifth transmission lines, and sixth transmission lines;

an input terminal;

an output terminal;

a seventh transmission line; and an eighth transmission line, wherein each of the first and second amplifier circuits comprises an amplifier transistor and a bias circuit, wherein each amplifier transistor comprises a plurality of cell transistors having different sizes, wherein each bias circuit is configured to supply a different bias current to each of the respective cell transistors, wherein the input signal is acquired at the input terminal, and the combined output signal is output from the output terminal, wherein each first transmission line is connected between a first node and an input of each first amplifier circuit, each second transmission line is connected between the first node and an input of each second amplifier circuit, and each third transmission line is connected between the input terminal and the first node, wherein each fourth transmission line is connected between an output of each first amplifier circuit and a second node, each fifth transmission line is connected between an output of each second amplifier circuit and the second node, and each sixth transmission line is connected between the second node and the output terminal, wherein each third transmission line is connected to a third node, wherein each sixth transmission line is connected to a fourth node, wherein the seventh transmission line is connected between the input terminal and the third node, and wherein the eighth transmission line is connected between the fourth node and the output terminal.

7. The power amplifier according to claim 6, wherein the bias circuit in each first amplifier circuit and the bias circuit in each second amplifier circuit are configured to supply the bias current to the same number of cell transistors and to cell transistors having the same size.

8. The power amplifier according to claim 5, wherein the bias circuit in the first amplifier circuit and the bias circuit in the second amplifier circuit are configured to supply the bias current to the same number of cell transistors and to cell transistors having the same size.

9. The power amplifier according to claim 1, further comprising:

an output terminal from which the combined output signal is output; and an output matching circuit connected between the combining circuit and the output terminal.

10. The power amplifier according to claim 9, wherein an impedance of the output matching circuit is variable.

11. The power amplifier according to claim 1, wherein the first and second amplifier circuits constitute a power stage of the power amplifier.

* * * * *